(12) United States Patent
Yamamoto

(10) Patent No.: US 7,139,039 B2
(45) Date of Patent: Nov. 21, 2006

(54) INPUT CIRCUIT OF TELEVISION TUNER

(75) Inventor: Masaki Yamamoto, Fukushima-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 603 days.

(21) Appl. No.: 10/413,868

(22) Filed: Apr. 15, 2003

(65) Prior Publication Data

US 2003/0193620 A1    Oct. 16, 2003

(30) Foreign Application Priority Data

Apr. 16, 2002    (JP)    ............................. 2002-114042

(51) Int. Cl.
*H04N 5/50*    (2006.01)
(52) U.S. Cl. .................. 348/731; 348/733; 455/188.2; 455/180.2
(58) Field of Classification Search ........ 348/731–733, 348/725, 729, 735; 455/188.2, 180.2, 180.4, 455/191.2, 193.1–193, 343.1; *H04N 5/50*
See application file for complete search history.

(56) References Cited

U.S. PATENT DOCUMENTS

| | | | |
|---|---|---|---|
| 4,710,737 A | | 12/1987 | Matsuta |
| 4,771,332 A | * | 9/1988 | Metoki ........................ 348/731 |
| 4,905,306 A | * | 2/1990 | Anderson ................. 455/191.3 |
| 6,351,294 B1 | * | 2/2002 | Yamamoto et al. ......... 348/731 |
| 6,842,198 B1 | * | 1/2005 | Suzuki et al. ................ 348/731 |
| 6,933,984 B1 | * | 8/2005 | Yamamoto et al. ......... 348/731 |

FOREIGN PATENT DOCUMENTS

| | | |
|---|---|---|
| EP | 0 348 697 | 1/1990 |
| EP | 1 047 192 | 10/2000 |
| EP | 1 213 837 | 6/2002 |
| JP | 2002-171185 | 6/2002 |

* cited by examiner

*Primary Examiner*—Trang Tran
(74) *Attorney, Agent, or Firm*—Brinks Hofer Gilson & Lione

(57) ABSTRACT

A VHF tuning circuit includes two tuning inductance devices connected in series with each other and having a junction thereof connected to an input terminal, and a first switch diode connected in parallel with the two in series inductance devices, and turned OFF at least when tuning is performed with a low range of a VHF band. A UHF tuning circuit is connected to the input terminal through a second switch diode that is turned ON at least when tuning is performed with a UHF band. The second switch diode is turned OFF when tuning is performed with a low range of the VHF band.

5 Claims, 4 Drawing Sheets

| RECEPTION/BAND | D1 | D2 |
|---|---|---|
| VHF/Lo | OFF | OFF |
| VHF/Hi | ON | ON |
| UHF | ON | ON |

| RECEPTION/BAND | D1 |
|---|---|
| VHF/Lo | OFF |
| VHF/Hi | ON |
| UHF | OFF |

INPUT CIRCUIT OF TELEVISION TUNER

BACKGROUND OF THE INVENTION

1. Field of the Invention

This invention relates to an input circuit of a television tuner for receiving television signals of a VHF band or television signals of a UHF band.

2. Description of the Related Art

FIG. 5 shows a known input circuit of a television tuner (hereinafter called merely "input circuit"). A VHF tuning circuit 42 is connected to an input terminal 41 to which television signals of VHF and UHF bands are inputted. The VHF tuning circuit 42 is a band-switching type tuning circuit that is designed for tuning with each channel of a low or high range of the VHF band. To achieve this construction, the tuning circuit includes four inductance devices 42a to 42d connected in series, a tuning varactor diode 42e connected in parallel with a series circuit of all the inductance devices and a switch diode 42f connected in parallel with the two inductance devices 42b and 42c at an intermediate part of the inductance devices 42a to 42d.

A junction between the two inductance devices 42b and 42c at another intermediate part of the four inductance devices 42a to 42d is connected to an input terminal 41. A voltage B is applied to an anode of the switch diode 42f through the inductance devices 42a to 42c and its cathode is connected to a collector of a switch transistor 43. An emitter is grounded. A high- or low-level switch voltage Vs is applied to a base of the switch transistor 43. An anode of the tuning varactor diode 42e is grounded, and a tuning voltage Vt is applied to its cathode. A cathode of a coupling varactor diode 44 is connected to a cathode of the tuning varactor diode 42e. An anode of this varactor diode 44 is grounded by a bias resistor 45 and is connected to a VHF high frequency amplifier 46.

A UHF tuning circuit 47 is connected to the input terminal 41. The UHF tuning circuit 47 tunes with channels of a UHF band and includes an inductance device 47a and two tuning varactor diodes 47b and 47c the cathodes of which are connected to each other and which are connected in parallel with the inductance device 47a. The tuning voltage Vt is applied to the cathodes. The cathodes are connected also to a UHF high frequency amplifier 48.

To receive television signals of a low range (VHF/Lo) or a high range (VHF/Hi) of the VHF band or of the UHF band (UHF) in the construction described above, the switch diode 42f (D1) is turned ON or OFF as shown in FIG. 6. To turn OFF the switch diode 42f, a switch voltage of a low level is applied to the base of the switch transistor 43. To turn it ON, a switch voltage Vs of a high level is applied. When the television signals of the VHF band are received, the VHF high frequency amplifier 46 operates but the UFH high frequency amplifier 48 does not operate. When the television signals of the UHF band are received, on the other hand, the VHF high frequency amplifier 46 does not operate but the UHF high frequency amplifier 48 operates.

Therefore, when the television signals of the low range of the VHF band are received, the switch diode 42f is turned OFF, and the inductance devices 42a to 42d and the tuning varactor diode 42e set the tuning frequency. When the television signals of the high range are received, the switch diode 42f is turned ON, the inductance devices 42b and 42c are connected in parallel while the inductance devices 42a and 42d are connected in series, and the inductance devices 42a and 42d and the tuning varactor diode 42e set the tuning frequency.

When the television signals of the UHF band are received, the switch diode 42f is turned OFF.

According to the known construction, the input circuit becomes an equivalent circuit shown in FIG. 7 when the television signals of the low range of the VHF band are received, and the inductance device 47a in the UHF tuning circuit 47 is connected in parallel with the inductance devices 42a and 42b in the VHF tuning circuit 42. Since the inductance value of the inductance device 47a in the UHF tuning circuit 47 is sufficiently smaller than the sum of the inductance values of the inductance devices 42a and 42b in the VHF tuning circuit 42, a signal loss increases when the tuning frequency of the VHF tuning circuit 42 deviates to a higher side, inviting the drop of a gain and deterioration of NF (noise factor) particularly when television signals near the lowest frequency are received.

When the television signals of the UHF band are received, the switch diode 42f that is turned OFF has a small capacitance, and the inductance devices 42b and 42c in the VHF tuning circuit 42 and the switch diode 42f constitute a resonance circuit. As this resonance frequency enters the UHF band, adverse influences are exerted on tuning performance of the UHF tuning circuit 47, inviting the drop of the gain and deterioration of NF near the resonance frequency.

SUMMARY OF THE INVENTION

It is therefore an object of the invention to eliminate mutual influences between the VHF tuning circuit and the UHF tuning circuit and to let the respective tuning circuits exhibit their original performance.

To solve these problems, an input circuit of a television tuner of the invention includes an input terminal to which television signals of VHF and UHF bands are inputted, a VHF tuning circuit connected to the input terminal and switched in such a fashion as to tune with a low or high range of the VHF band, and a UHF tuning circuit connected to the input terminal and tuning with the UHF band, wherein the VHF tuning circuit has two tuning inductance devices connected in series with each other and having a junction thereof connected to the input terminal, and a first switch diode connected in parallel with the two in series inductance devices as a whole and being turned OFF at least when tuning is made with the low range and being turned ON when tuning is made with the high range, the UHF tuning circuit is connected to the input terminal through a second switch diode that is turned ON at least when television signals of the UHF band are received, and the second switch diode is turned OFF when television signals of the low range are received.

The first switch diode is turned ON when the television signals of the UHF band are received.

A coupling inductance device for connecting the UHF tuning circuit to the input terminal is inserted in series with the second switch diode, and the second switch diode is turned ON when the television signals of the high range of the VHF band are received.

A high level voltage is applied to an anode of each of the first and second switch diodes, and a switch transistor having a collector thereof connected to each cathode and an emitter thereof grounded is disposed, and is turned ON when the television signals of the high range and of the UHF band are received and are turned OFF when the television signals of the low range are received.

DESCRIPTION OF THE PREFERRED EMBODIMENTS

Figures 1, 2:
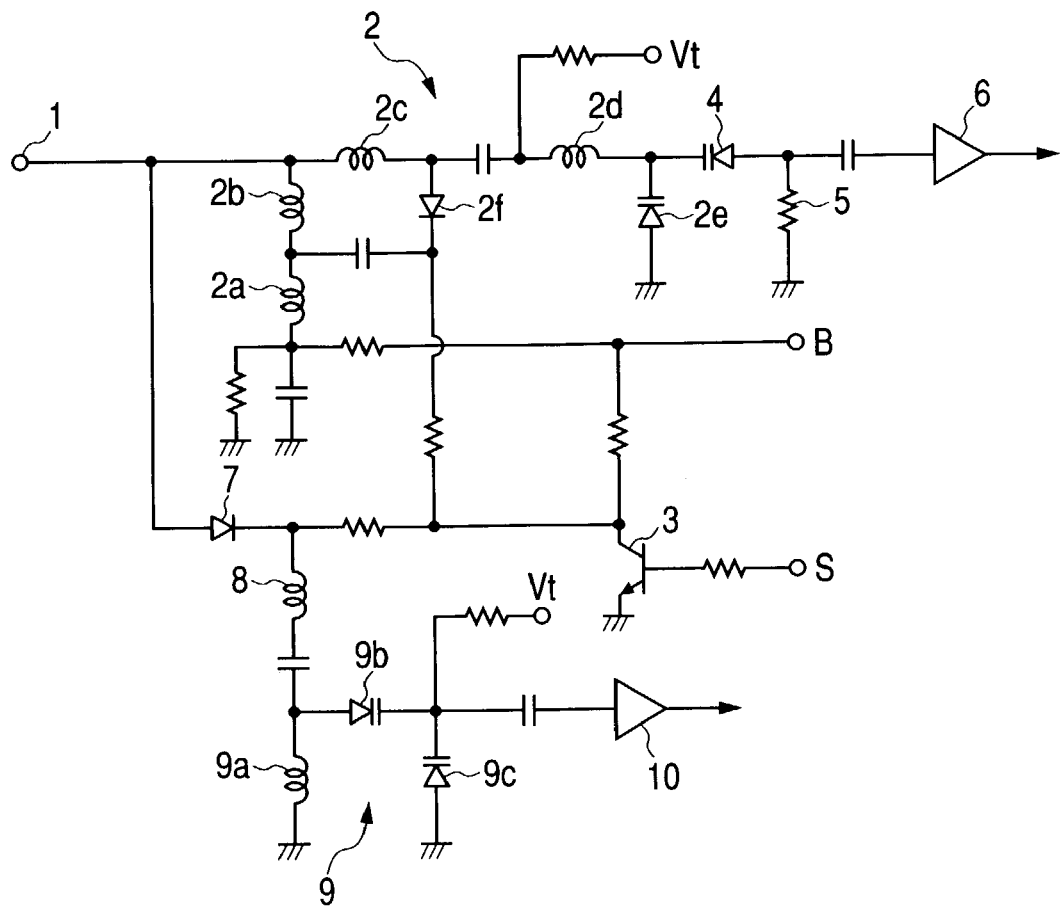
FIG. 1 is a circuit diagram showing a construction of an input circuit of a television tuner according to the invention.
FIG. 2 is a relational diagram between a reception band and an ON/OFF state of a switch diode in the input circuit of the television tuner according to the invention.

An embodiment of an input circuit of a television tuner (hereinafter called merely "input circuit") according to the invention will be explained with reference to FIG. 1. A VHF tuning circuit 2 is connected to an input terminal 1 to which television signals of VHF and UHF bands are inputted The VHF tuning circuit 2 uses a band-switching type tuning circuit designed for tuning with each channel of a low or high range of the VHF band and shares similar circuitry characteristics as that of the VHF tuning circuit 42 of the introduced prior art. In other words, this tuning circuit 2 includes four inductance devices 2a to 2d connected in series, a tuning varactor diode 2e connected in parallel with all the inductance devices and a first switch diode 2f connected in parallel with the two in series inductance devices 2b and 2c at an intermediate part of the inductance devices 2a to 2d.

The junction between the two inductance devices 2b and 2c at another intermediate part of the four inductance devices 2a to 2d is connected to the input terminal 1. A voltage VB is applied to an anode of the first switch diode 2f through the inductance devices 2a to 2c and its cathode is connected to a collector of a switch transistor 3. An emitter is grounded. A high- or low-level switch voltage Vs is applied to a base of the switch transistor 3. An anode of the tuning varactor diode 2e is grounded, and a tuning voltage Vt is applied to its cathode. A cathode of a coupling varactor diode 4 is connected to a cathode of the tuning varactor diode 2e. An anode of this varactor diode 4 is grounded by a bias resistor 5 and is connected to a VHF high frequency amplifier 6.

A UHF tuning circuit 9 is connected to the input terminal 1 through a series circuit of a second switch diode 7 and a coupling inductance device 8. The voltage VB is applied to an anode of the second switch diode 7 and a cathode is connected to the collector of the switch transistor 3. The UHF tuning circuit 9 tunes with channels of a UHF band and shares similar circuitry characteristics as that of the UHF tuning circuit 47 of the introduced prior art. The UHF tuning circuit 9 includes an inductance device 9a and two tuning varactor diodes 9b and 9c the cathodes of which are connected to each other and which are connected in parallel with the inductance device 9a. The tuning voltage vt is applied to the cathodes. The cathodes are connected also to a UHF high frequency amplifier 10.

To receive television signals of a low range (VHF/Lo) or a high range (VHF/Hi) of the VHF band or of the UHF band (UHF) in the embodiment described above, both of the first switch diode 2f (D1) and the second switch diode (D2) are turned ON or OFF as shown in FIG. 2. To turn OFF the first switch diode 2f and the second switch diode 7, a switch voltage Vs of a low level is applied to the base of the switch transistor 3. To turn them ON, a switch voltage Vs of a high level is applied. When the television signals of the VHF band are received, the VHF high frequency amplifier 6 operates but the UFH high frequency amplifier 10 does not operate. When the television signals of the UHF band are received, on the other hand, the VHF high frequency amplifier 6 does not operate but the UHF high frequency amplifier 10 operates.

Figure 3:
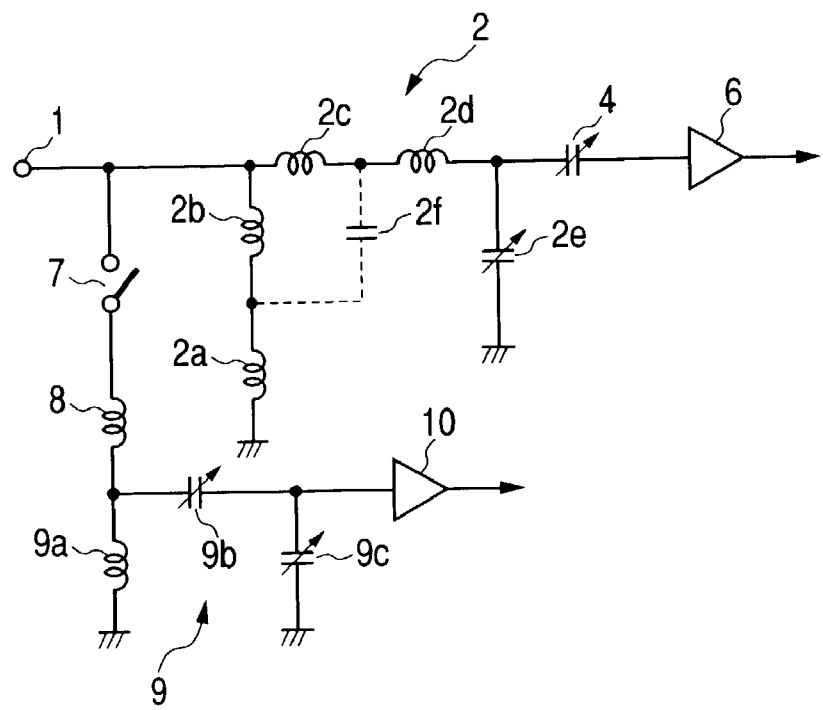
FIG. 3 is an equivalent circuit diagram when a television signal of a low range of a VHF band is received in the input circuit of the television tuner according to the invention.

Therefore, when the television signals of the low range of the VHF band are received, the first switch diode 2f and the second switch diode 7 are turned OFF, and the input circuit becomes an equivalent circuit shown in FIG. 3. The inductance devices 2a to 2d and the tuning varactor diode 2e in the VHF tuning circuit 2 set the tuning frequency. Therefore, the VHF tuning circuit 2 is cut off from the UHF tuning circuit 9 and can perform without being affected by the UHF tuning circuit 9.

Figure 4:
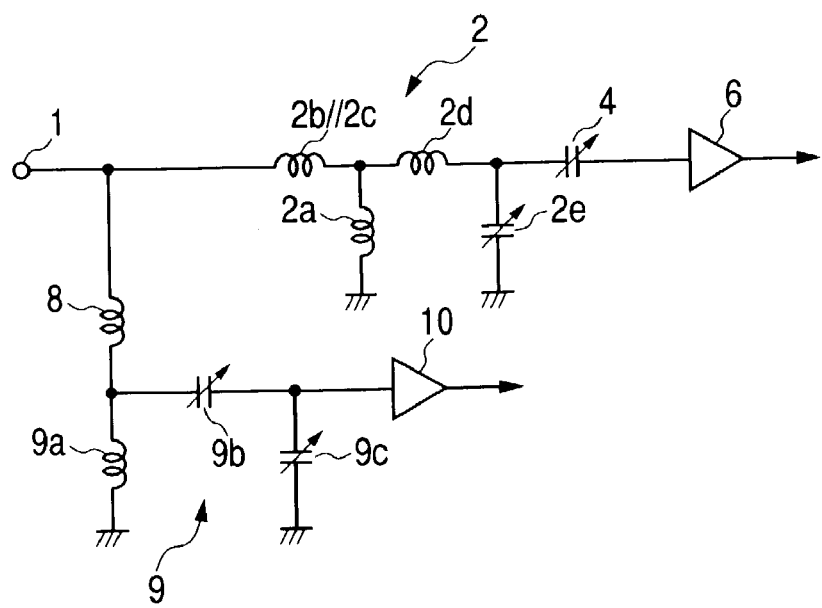
FIG. 4 is an equivalent circuit diagram when television signals of a high range of the VHF band and a UHF band are received in the input circuit of the television tuner according to the invention.
Figures 5, 6:
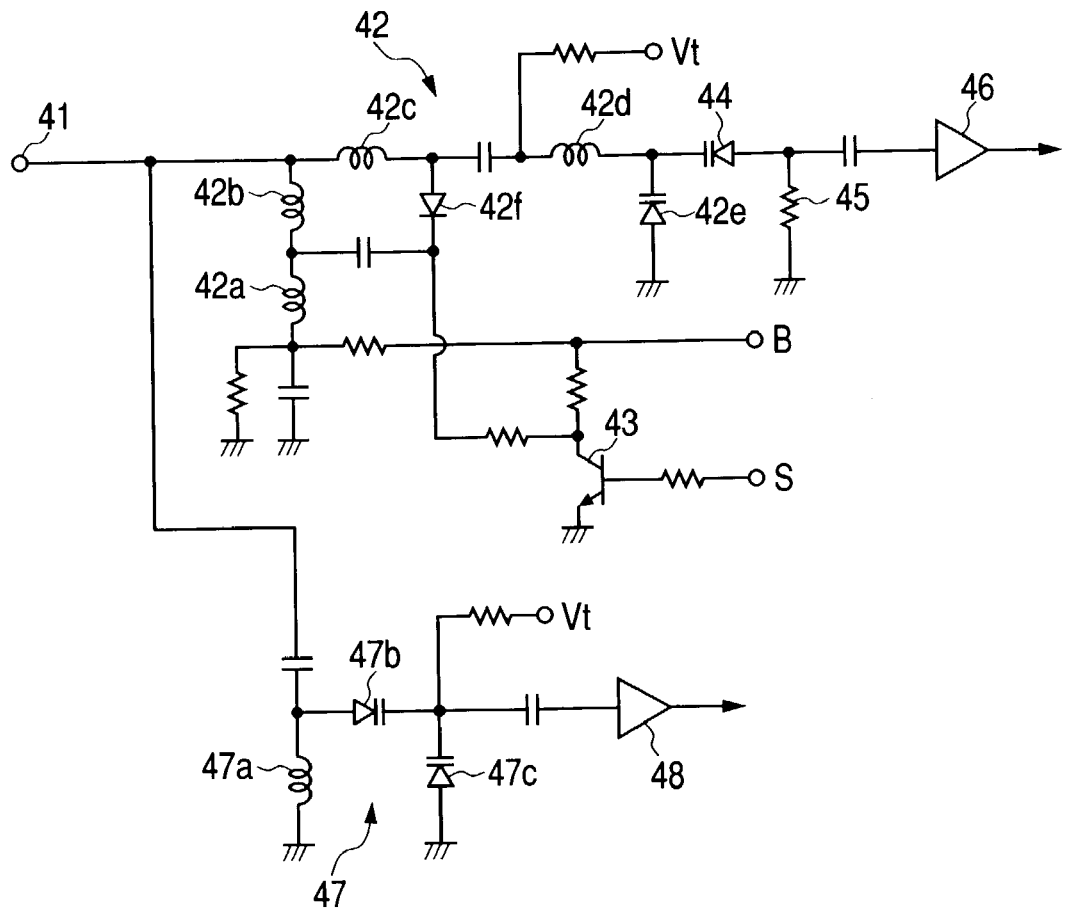
FIG. 5 is a circuit diagram showing a construction of a known input circuit of a television tuner.
FIG. 6 is a relational diagram between a reception band and an ON/OFF state of a switch diode in the known input circuit of the television tuner.
Figure 7:
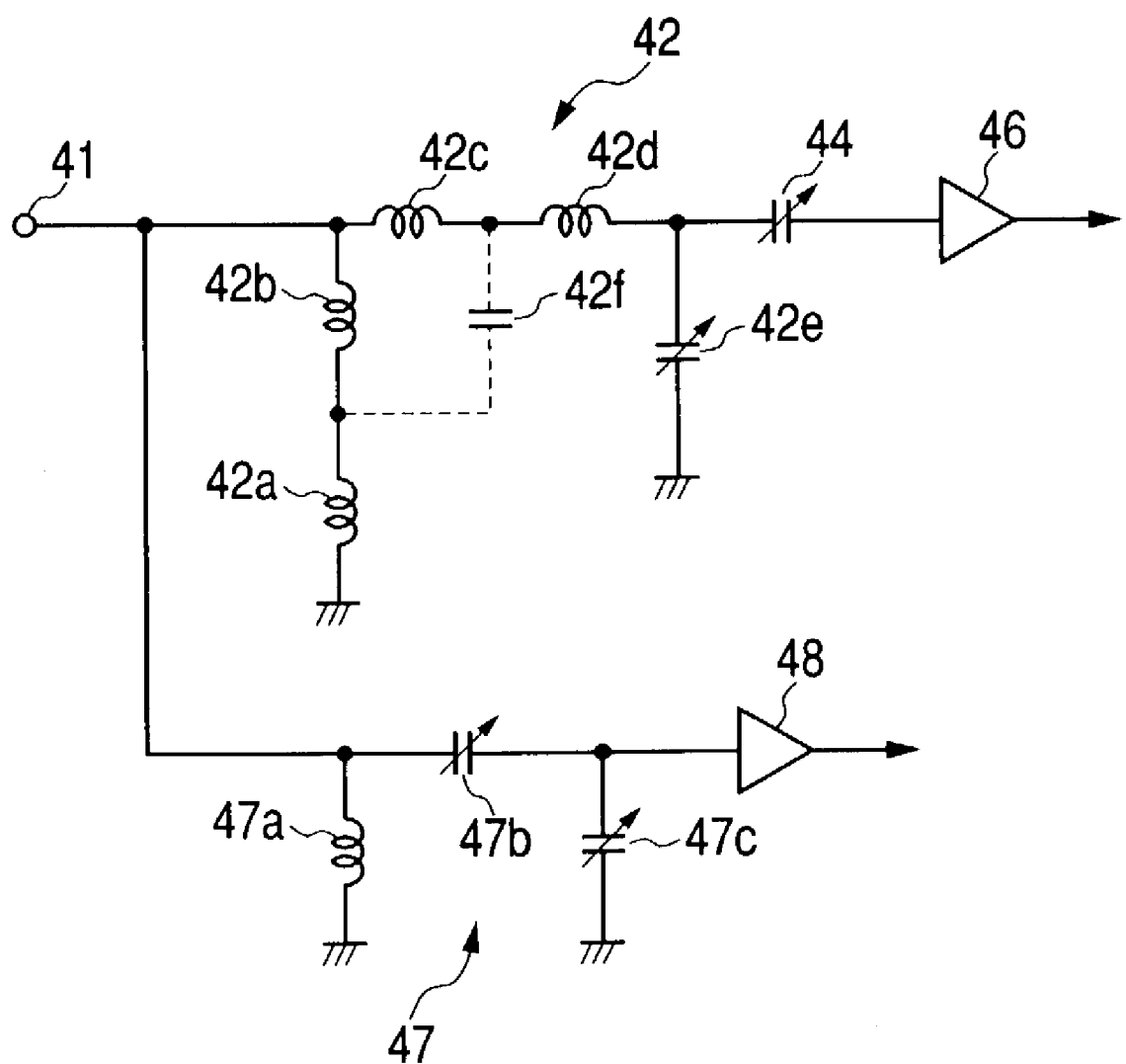
FIG. 7 is an equivalent circuit diagram when television signals of a low range of the VHF band and the UHF band are received in the known input circuit of the television tuner.

When the television signals of the high range are received, the first switch diode 2f and the second switch diode 7 are turned ON, and the input circuit becomes an equivalent circuit shown in FIG. 4. The inductance devices 2b and 2c are connected in parallel while the inductance devices 2a and 2d are connected in series, and the inductance devices 2a and 2d and the tuning varactor diode 2e set the tuning frequency. In this case, the coupling inductance device 8 and the inductance device 9a of the UHF tuning circuit 9 that are connected in series and the inductance devices 2b and 2c connected the VHF tuning circuit 2 connected in parallel with each other step up the signal source impedance on the side of the input terminal 1 and connection is established with the VHF tuning circuit 2 (constituted by the inductance devices 2a and 2d and the tuning varactor diode 2e in this case). Therefore, tuning selectivity is highly improved.

When the television signals of the UHF band are received, on the other hand, the first switch diode 2f and the second switch diode 7 are turned ON and the input circuit becomes the equivalent circuit shown in FIG. 4 Since the first switch diode 2f is ON in this case, an unnecessary resonance circuit is not formed inside the VHF tuning circuit 2 and the VHF tuning circuit 2 does not affect the UHF tuning circuit 9.

As explained above, the VHF tuning circuit includes the two tuning inductance devices which are connected in series with each other and the junction of which is connected to the input terminal, and the first switch diode which is connected in parallel with the two in series inductance devices and is turned OFF when the VHF tuning circuit tunes with at least the low range of the VHF band and is turned ON when the tuning circuit tunes with the high range. The UHF tuning circuit is connected to the input terminal through the second switch diode that is turned ON at least when the television signals of the UHF band are received and this second switch diode is turned OFF when the television signals of the low range are received. Therefore, the VHF tuning circuit is cut off from the UHF turning circuit and can exhibit its original characteristics without being affected by the UFH tuning circuit.

Since the first switch diode is turned ON at the time of reception of the television signals of the UHF band, an unnecessary resonance circuit is not formed inside the VHF turning circuit, and the VHF tuning circuit does not affect the UHF tuning circuit.

The coupling inductance device for coupling the UHF tuning circuit to the input terminal is inserted in series to the second switch diode and is turned ON when the television signals of the high range of the VHF band are received. Therefore, these two inductance devices in the VHF tuning circuit are connected in parallel. These inductance devices, the coupling inductance device and the inductance device of the UHF tuning circuit connected in series step up the signal source impedance on the input signal side and connection with the VHF tuning circuit is attained. Therefore, tuning selectivity of the VHF tuning circuit is highly improved The high level voltage is applied to the anodes of the first and second switch diodes, and the switch transistor, with its collector connected to each cathode and its emitter grounded, is turned ON when the television signals of the high range and the UHF band are received and is turned OFF when the television signals of the low range are received. Therefore, both of the first and second switch diodes can be turned OFF when receiving the television signals of the low range of the VHF band and can be turned ON when receiving the television signals of the high range of the VHF band and of the UHF band.

What is claimed is:

1. An input circuit of a television tuner comprising:
   an input terminal to which television signals of VHF and UHF bands are inputted;
   a VHF tuning circuit connected to said input terminal, said VHF tuning circuit being tunable with a low or high VHF band range;
   a UHF tuning circuit connected to said input terminal, said UHF tuning circuit being tunable with said UHF band;
   wherein said VHF tuning circuit has two tuning inductance devices connected in series with each other and having a junction thereof connected to said input terminal, and a first switch diode connected in parallel with said two in series inductance devices said first switch diode being turned OFF at least when tuning is performed with said low VHF band range and being turned ON when tuning is performed with said high VHF band range, said UHF tuning circuit is connected to said input terminal through a second switch diode that is turned ON at least when tuning is performed with said UHF band, and said second switch diode is turned OFF tuning is performed with said low VHF band range.

2. The input circuit of a television tuner as in claim 1, wherein said first switch diode is turned ON when tuning is performed with said UHF band.

3. The input circuit of a television tuner as in claim 1, wherein a coupling inductance device for connecting said UHF tuning circuit to said input terminal is inserted in series with said second switch diode.

4. The input circuit of a television tuner as in claim 1, wherein said second switch diode is turned ON when tuning is performed with said high VHF band range.

5. The input circuit of a television tuner in claim 1, wherein a high level voltage is applied to an anode of each of said first and second switch diodes, and a switch transistor having a collector thereof connected to each cathode and an emitter thereof grounded is disposed, and said switch transistor is turned ON when said high VHF band range and said UHF band signals are received and is turned OFF when said low VHF band range signals are received.

* * * * *

UNITED STATES PATENT AND TRADEMARK OFFICE
CERTIFICATE OF CORRECTION

PATENT NO. : 7,139,039 B2  
APPLICATION NO. : 10/413868  
DATED : November 21, 2006  
INVENTOR(S) : Masaki Yamamoto It is certified that error appears in the above-identified patent and that said Letters Patent is hereby corrected as shown below:

On the Title Page

In column 2, line 4, after "6,842,198" delete "B1" and substitute --B2-- in its place.

In column 2, line 5, after "6,933,984" delete "B1" and substitute --B2-- in its place.

Signed and Sealed this

Tenth Day of April, 2007

JON W. DUDAS  
*Director of the United States Patent and Trademark Office*